%PDF

(12) United States Patent
Khaira

(10) Patent No.: US 7,652,496 B2
(45) Date of Patent: Jan. 26, 2010

(54) COMMUTATION FAILURE DETECTION CIRCUIT FOR BACK-TO-BACK SCR CIRCUIT AND CONTROLLING METHOD THEREOF HAVING RELATIVELY BETTER EFFICIENCY

(75) Inventor: Tirath Singh Khaira, Taoyuan Hsien (TW)

(73) Assignee: DET International Holding Limited, George Town (KY)

( * ) Notice: Subject to any disclaimer, the term of this patent is extended or adjusted under 35 U.S.C. 154(b) by 263 days.

(21) Appl. No.: 11/880,259

(22) Filed: Jul. 20, 2007

(65) Prior Publication Data

US 2009/0021278 A1    Jan. 22, 2009

(51) Int. Cl.
*G01R 31/26* (2006.01)
(52) U.S. Cl. .................................... 324/765
(58) Field of Classification Search .......... 324/765, 324/555, 158.1, 763; 438/14–18; 257/48; 363/72, 16–20, 22–25; 702/108–126; 219/492, 219/497
See application file for complete search history.

(56) References Cited

U.S. PATENT DOCUMENTS

| 4,506,146 A | * | 3/1985 | Rice et al. ................... 219/499 |
| 4,845,342 A | * | 7/1989 | Chen ......................... 219/501 |
| 4,882,782 A | * | 11/1989 | Kimizuka et al. ........... 361/100 |

* cited by examiner

*Primary Examiner*—Ha Tran T Nguyen
*Assistant Examiner*—Tung X Nguyen
(74) *Attorney, Agent, or Firm*—Haverstock & Owens LLP

(57) ABSTRACT

The configurations of a commutation failure detection circuit for a back-to-back SCR circuit and the controlling methods thereof are provided. The proposed commutation failure detection circuit includes a first detecting signal generator coupled to the back-to-back SCR circuit for detecting a commutation at a negative half cycle of an AC input voltage and including a first non-conductive signal amplifier circuit generating a first non-conductive signal when the back-to-back SCR circuit is not conductive at the negative half cycle of the AC input voltage and a second detecting signal generator coupled to the back-to-back SCR circuit for detecting the commutation at a positive half cycle of the AC input voltage and including a second non-conductive signal amplifier circuit generating a second non-conductive signal when the back-to-back SCR circuit is not conductive at the positive half cycle of the AC input voltage.

16 Claims, 7 Drawing Sheets

COMMUTATION FAILURE DETECTION CIRCUIT FOR BACK-TO-BACK SCR CIRCUIT AND CONTROLLING METHOD THEREOF HAVING RELATIVELY BETTER EFFICIENCY

FIELD OF THE INVENTION

The present invention relates to a commutation failure detection circuit for a back-to-back connected silicon controlled rectifier (SCR) circuit. More particularly, the present invention relates to a commutation failure detection circuit for a back-to-back SCR circuit having relatively better efficiency.

BACKGROUND OF THE INVENTION

Using back-to-back connected SCRs as a static switch in between an AC power supply and a load is quite common nowadays. For example, please refer to FIG. 1, it shows a schematic circuit diagram of a conventional tap changing transformer including six pairs of back-to-back SCRs (SCR1 to SCR6) for line voltage regulation (with input supply: 240-520V and output supply: 220+/−10% V). In which, each pair of the back-to-back SCRs has a first terminal (k1(1) to k1(6)) and a second terminal (k2(1) to k2(6), and each of the SCRs has a gate (G1(1) to G1(6) and G2(1) to G2(6)). In such an application of SCRs, a commutation failure detection circuit is required to avoid a dramatic damage to the transformer caused by a malfunction of the SCRs.

Please refer to FIG. 2, which shows a block diagram of a conventional commutation failure detection circuit using bridge and opto-coupler for a back-to-back SCR circuit. In which, it shows a back-to-back SCR circuit and the failure detection circuit including a resistor bank coupled to the back-to-back SCR circuit, a full-bridge circuit coupled to the resistor bank and the back-to-back SCR circuit, and an opto isolator having an opto-coupler (not shown) coupled to the full-bridge circuit, receiving a DC supply and outputting an output.

Assume that the first SCR of a SCR pair of the back-to-back SCR circuit (not shown) is triggered at some firing angle in a positive half cycle of an AC input voltage (not shown) of the back-to-back SCR circuit. A forward voltage is present across the SCR pair until any one of the SCR starts conducting. This forward voltage is applied to the full-bridge rectifier through the resistor bank. The resistor bank serves the purpose of limiting the current flowing into the full-bridge circuit. The rectified voltage turns on a light emitting diode (not shown) in the opto-coupler and this signal is transmitted to the output.

When any one of the SCR pair starts conducting, the voltage across the opto-diode is zero. Therefore, there is no signal on the opto-coupler output. A similar operation follows in the negative half cycle of the AC input voltage.

The advantages of the aforementioned conventional failure detection circuit using bridge and opto-coupler are that the components count of which is relatively low. And the disadvantages of the aforementioned conventional failure detection circuit using bridge and opto-coupler are that the total applied voltage is dropped across the series-connected resistor bank around the zero crossing of the AC input voltage. Therefore, a forward current available to turn on the full-bridge including four diodes builds up slowly. Thus, there is always some delay present in commutation failure detection of the SCR.

Please refer to FIG. 3, which shows a block diagram of a conventional commutation failure detection circuit using opto-couplers for a back-to-back SCR circuit. In which, it shows a back-to-back SCR circuit and the failure detection circuit including a resistor bank coupled to the back-to-back SCR circuit and two opto isolators each having an opto-coupler (not shown) and outputting an output, one opto isolator is coupled to the resistor bank, and the other is coupled to the back-to-back SCR circuit and receives a DC supply voltage.

Assume that the first SCR of a SCR pair of the back-to-back SCR circuit (not shown) is triggered at some firing angle in the positive half cycle of the AC input voltage (not shown) of the back-to-back SCR circuit. The forward voltage is present across the SCR pair until any one of the SCR starts conducting. A maximum voltage drop appears across the series resistor bank, which serves to limit the current flowing into the opto-couplers. One opto-coupler is connected in reverse direction to allow conduction during a negative half-cycle of the AC input voltage. An input voltage of each of the opto-couplers turns on an opto-diode (not shown) presents in each of the opto-couplers and transmits a signal to the opto-coupler output.

When any one of the SCR pair starts conducting, the voltage across the opto-diode is zero. Therefore, there is no signal at the opto-coupler output. A similar operation follows in the negative half cycle of the AC input voltage.

The advantages of the above-mentioned conventional failure detection circuit using opto-couplers are that the components count of which is also relatively low. But the disadvantages of the above-mentioned conventional failure detection circuit using opto-couplers are that the total applied voltage is dropped across the series-connected resistor bank around the zero crossing of the AC input voltage. Therefore, the forward current available to turn on the opto-diodes builds up slowly. Thus, there is always some delay present in commutation failure detection of the SCR.

Keeping the drawbacks of the prior arts in mind, the applicant proposes a commutation failure detection circuit for a back-to-back SCR circuit and the controlling methods thereof having relatively better efficiency.

SUMMARY OF THE INVENTION

It is therefore an object of the present invention to provide a commutation failure detection circuit for a back-to-back SCR circuit and the controlling method thereof having relatively better efficiency in minimizing the delay present in commutation failure detection of the back-to-back SCR circuit.

According to the first aspect of the present invention, a commutation failure detection circuit for a back-to-back silicon controlled rectifier (SCR) circuit includes a first detecting signal generator coupled to the back-to-back SCR circuit for detecting a commutation at a negative half cycle of an AC input voltage and including a first non-conductive signal amplifier circuit generating a first non-conductive signal when the back-to-back SCR circuit is not conductive at the negative half cycle of the AC input voltage, a first non-conductive signal driver receiving and transferring the first non-conductive signal, and a first non-conductive signal isolator receiving the transferred first non-conductive signal for generating a first commutation detecting signal at a first status when the first non-conductive signal is absent, and a second detecting signal generator coupled to the back-to-back SCR circuit for detecting the commutation at a positive half cycle of the AC input voltage and including a second non-conductive signal amplifier circuit generating a second non-conductive signal when the back-to-back SCR circuit is not conductive at the positive half cycle of the AC input voltage, a second non-conductive signal driver receiving and transferring the second non-conductive signal, and a second non-conductive signal isolator receiving the transferred second non-conductive signal for generating a second commutation detecting signal at the first status when the second non-conductive signal is absent.

Preferably, the commutation failure detection circuit further includes an output node coupled to the first and the second non-conductive signal isolators for outputting one of the first and the second commutation detecting signals, in which the first commutation detecting signal is in a second status when the first non-conductive signal is present, and the second commutation detecting signal is in the second status when the second non-conductive signal is present.

Preferably, the first and the second statuses are a logic high and a logic low statuses respectively, each of the first and the second non-conductive signal isolators includes an opto-coupler having two input terminals for receiving a DC supply voltage and receiving and transmitting one of the transferred first and the transferred second non-conductive signals respectively, an output terminal for outputting one of the transmitted and transferred first and the transmitted and transferred second non-conductive signals and a ground terminal, and a first resistor having a first terminal coupled to the outputting terminal for receiving one of the transmitted and transferred first and the transmitted and transferred second non-conductive signals and coupled to the outputting node for generating one of the first and the second commutation detecting signals, and a second terminal receiving a supply voltage for forming a conducting path via the ground terminal to output one of the first and the second commutation detecting signals in the logic high status and forming the first and the second commutation detecting signals in the logic low status respectively.

Preferably, the back-to-back SCR circuit includes a first and a second SCRs each having a cathode, the first non-conductive signal amplifier circuit is coupled to the cathode of the first SCR, the second non-conductive signal amplifier circuit is coupled to the cathode of the second SCR, and each of the first and the second non-conductive signal amplifier circuits includes a signal bias resistor having a first terminal coupled to a DC supply voltage for forming a non-conductive signal bias and a second terminal, a detection current limiting resistor having a first terminal coupled to the second terminal of the signal bias resistor for limiting a detection current flowing through the detection current limiting resistor and a second terminal, a reverse blocking diode having an anode coupled to the second terminal of the detection current limiting resistor and a cathode coupled to one of the cathodes of the first and the second SCRs for preventing a reverse voltage thereof, and a signal amplifier amplifying one of the first and the second non-conductive signals and including a first stage including a first transistor having a first terminal coupled to the anode of the reverse blocking diode, a second terminal and a control terminal, and a first resistor having a first terminal coupled to the control terminal of the first transistor and a second terminal coupled to one of the cathodes of the first and the second SCRs, and a second stage including a second transistor having a first terminal coupled to the second terminal of the first resistor and a ground, a second terminal coupled to the first terminal of the detection current limiting resistor and a control terminal, and a second resistor having a first terminal coupled to the control terminal of the second transistor and a second terminal coupled to the second terminal of the first transistor.

Preferably, each of the first and the second non-conductive signal drivers includes a zener diode having an anode and a cathode coupled to the first terminal of the detection current limiting resistor, a third resistor having a first terminal coupled to the anode of the zener diode and a second terminal, a third transistor having a first terminal coupled to the ground, a second terminal and a control terminal coupled to the second terminal of the third resistor, a fourth resistor having a first terminal receiving the supply voltage and a second terminal coupled to the second terminal of the third transistor, a fifth resistor having a first terminal coupled to the second terminal of the fourth resistor and a second terminal, a fourth transistor having a first terminal coupled to the ground, a second terminal and a control terminal coupled to the second terminal of the fifth resistor, and a sixth resistor having a first terminal coupled to the second terminal of the fourth transistor and a second terminal outputting one of the transferred first and the transferred second non-conductive signals.

Preferably, each of the first and the second non-conductive signal drivers includes a third resistor having a first terminal coupled to the first terminal of the detection current limiting resistor and a second terminal, a third transistor having a first terminal coupled to the ground, a second terminal and a control terminal coupled to the second terminal of the third resistor, a fourth resistor having a first terminal receiving the supply voltage and a second terminal coupled to the second terminal of the third transistor, a fifth resistor having a first terminal coupled to the second terminal of the fourth resistor and a second terminal, a fourth transistor having a first terminal coupled to the ground, a second terminal and a control terminal coupled to the second terminal of the fifth resistor, and a sixth resistor having a first terminal coupled to the second terminal of the fourth transistor and a second terminal outputting one of the transferred first and the transferred second non-conductive signals.

Preferably, the back-to-back SCR circuit includes a first and a second SCRs each having a cathode, the first non-conductive signal amplifier circuit is coupled to the cathode of the first SCR, the second non-conductive signal amplifier circuit is coupled to the cathode of the second SCR, and each of the first and the second non-conductive signal amplifier circuits includes a signal bias resistor having a first terminal coupled to a DC supply voltage for forming a non-conductive signal bias and a second terminal, a detection current limiting resistor having a first terminal coupled to the second terminal of the signal bias resistor for limiting a detection current flowing through the detection current limiting resistor and a second terminal, a reverse blocking diode having an anode coupled to the second terminal of the detection current limiting resistor and a cathode coupled to one of the cathodes of the first and the second SCRs for preventing a reverse voltage thereof, and a signal amplifier amplifying one of the first and the second non-conductive signals and including an amplifying diode having an anode coupled to a ground and one of the cathodes of the first and the second SCRs and a cathode coupled to the first terminal of the detection current limiting resistor.

Preferably, each of the first and the second non-conductive signal drivers includes a zener diode having an anode and a cathode coupled to the first terminal of the detection current limiting resistor, a first resistor having a first terminal coupled to the anode of the zener diode and a second terminal, a first transistor having a first terminal coupled to the ground, a second terminal and a control terminal coupled to the second terminal of the first resistor, a second resistor having a first terminal receiving the supply voltage and a second terminal coupled to the second terminal of the first transistor, a third resistor having a first terminal coupled to the second terminal of the second resistor and a second terminal, a second transistor having a first terminal coupled to the ground, a second terminal and a control terminal coupled to the second terminal of the third resistor, and a fourth resistor having a first terminal coupled to the second terminal of the second transistor and a second terminal outputting one of the transferred first and the transferred second non-conductive signals.

Preferably, each of the first and the second non-conductive signal drivers includes a first resistor having a first terminal coupled to the first terminal of the detection current limiting resistor and a second terminal, a first transistor having a first terminal coupled to the ground, a second terminal and a control terminal coupled to the second terminal of the first resistor, a second resistor having a first terminal receiving the supply voltage and a second terminal coupled to the second terminal of the first transistor, a third resistor having a first terminal coupled to the second terminal of the second resistor and a second terminal, a second transistor having a first terminal coupled to the ground, a second terminal and a control terminal coupled to the second terminal of the third resistor, and a fourth resistor having a first terminal coupled to the second terminal of the second transistor and a second terminal outputting one of the transferred first and the transferred second non-conductive signals.

According to the second aspect of the present invention, a commutation failure detection circuit for a back-to-back SCR circuit includes a first detecting signal generator coupled to the back-to-back SCR circuit for detecting a commutation at a negative half cycle of an AC input voltage and including a first non-conductive signal amplifier circuit generating a first non-conductive signal when the back-to-back SCR circuit is not conductive at the negative half cycle of the AC input voltage, and including a first non-conductive signal amplifier amplifying the first non-conductive signal, and a second detecting signal generator coupled to the back-to-back SCR circuit for detecting the commutation at a positive half cycle of the AC input voltage and including a second non-conductive signal amplifier circuit generating a second non-conductive signal when the back-to-back SCR circuit is not conductive at the positive half cycle of the AC input voltage, and including a second non-conductive signal amplifier amplifying the second non-conductive signal.

Preferably, the commutation failure detection circuit further includes a first opto-coupler driver circuit receiving, transferring and transmitting the first non-conductive signal for generating a first commutation detecting signal at a first status when the first non-conductive signal is absent and a second opto-coupler driver circuit receiving, transferring and transmitting the second non-conductive signal for generating a second commutation detecting signal at the first status when the second non-conductive signal is absent and an output node coupled to the first and the second opto-coupler driver circuits for outputting one of the first and the second commutation detecting signals, in which the first commutation detecting signal is in a second status when the first non-conductive signal is present, and the second commutation detecting signal is in the second status when the second non-conductive signal is present.

Preferably, the first and the second statuses are a logic high and a logic low statuses respectively, each of the first and the second non-conductive signal amplifier circuits includes a detection current limiting resistor having a first terminal and a ground, and each of the first and the second opto-coupler driver circuits includes a zener diode having an anode and a cathode coupled to the first terminal of the detection current limiting resistor, a third resistor having a first terminal coupled to the anode of the zener diode and a second terminal, a third transistor having a first terminal coupled to the ground, a second terminal and a control terminal coupled to the second terminal of the third resistor, a fourth resistor having a first terminal receiving a DC supply voltage and a second terminal coupled to the second terminal of the third transistor, a fifth resistor having a first terminal coupled to the second terminal of the fourth resistor and a second terminal, a fourth transistor having a first terminal coupled to the ground, a second terminal and a control terminal coupled to the second terminal of the fifth resistor, a sixth resistor having a first terminal coupled to the second terminal of the fourth transistor and a second terminal outputting one of the transferred first and the transferred second non-conductive signals, an opto-coupler having two input terminals for receiving the supply voltage and receiving and transmitting one of the transferred first and the transferred second non-conductive signals respectively, an output terminal for outputting one of the transmitted and transferred first and the transmitted and transferred second non-conductive signals and a ground terminal, and a seventh resistor having a first terminal coupled to the outputting terminal for receiving one of the transmitted and transferred first and the transmitted and transferred second non-conductive signals and coupled to the outputting node for generating one of the first and the second commutation detecting signals, and a second terminal receiving the supply voltage for forming a conducting path via the ground terminal to output one of the first and the second commutation detecting signals in the logic high status and forming one of the first and the second commutation detecting signals in the logic low status respectively.

Preferably, the first and the second statuses are a logic high and a logic low statuses respectively, each of the first and the second non-conductive signal amplifier circuits includes a detection current limiting resistor having a first terminal and a ground, and each of the first and the second opto-coupler driver circuits includes a third resistor having a first terminal coupled to the first terminal of the detection current limiting resistor and a second terminal, a third transistor having a first terminal coupled to the ground, a second terminal and a control terminal coupled to the second terminal of the third resistor, a fourth resistor having a first terminal receiving a DC supply voltage and a second terminal coupled to the second terminal of the third transistor, a fifth resistor having a first terminal coupled to the second terminal of the fourth resistor and a second terminal, a fourth transistor having a first terminal coupled to the ground, a second terminal and a control terminal coupled to the second terminal of the fifth resistor, a sixth resistor having a first terminal coupled to the second terminal of the fourth transistor and a second terminal outputting one of the transferred first and the transferred second non-conductive signals, an opto-coupler having two input terminals for receiving the supply voltage and receiving and transmitting one of the transferred first and the transferred second non-conductive signals respectively, an output terminal for outputting one of the transmitted and transferred first and the transmitted and transferred second non-conductive signals and a ground terminal, and a seventh resistor having a first terminal coupled to the outputting terminal for receiving one of the transmitted and transferred first and the transmitted and transferred second non-conductive signals and coupled to the outputting node for generating one of the first and the second commutation detecting signals, and a second terminal receiving the supply voltage for forming a conducting path via the ground terminal to output one of the first and the second commutation detecting signals in the logic high status and forming one of the first and the second commutation detecting signals in the logic low status respectively.

Preferably, the first and the second statuses are a logic high and a logic low statuses respectively, each of the first and the second non-conductive signal amplifier circuits includes a detection current limiting resistor having a first terminal and a ground, and each of the first and the second opto-coupler driver circuits includes a zener diode having an anode and a cathode coupled to the first terminal of the detection current limiting resistor, a first resistor having a first terminal coupled to the anode of the zener diode and a second terminal, a first transistor having a first terminal coupled to the ground, a second terminal and a control terminal coupled to the second terminal of the first resistor, a second resistor having a first terminal receiving a DC supply voltage and a second terminal coupled to the second terminal of the first transistor, a third resistor having a first terminal coupled to the second terminal of the second resistor and a second terminal, a second transistor having a first terminal coupled to the ground, a second terminal and a control terminal coupled to the second terminal of the third resistor, a fourth resistor having a first terminal coupled to the second terminal of the second transistor and a second terminal outputting one of the transferred first and the transferred second non-conductive signals, an opto-coupler having two input terminals for receiving the supply voltage and receiving and transmitting one of the transferred first and the transferred second non-conductive signals respectively, an output terminal for outputting one of the transmitted and transferred first and the transmitted and transferred second non-conductive signals and a ground terminal, and a fifth resistor having a first terminal coupled to the outputting terminal for receiving one of the transmitted and transferred first and the transmitted and transferred second non-conductive signals and coupled to the outputting node for generating one of the first and the second commutation detecting signals, and a second terminal receiving the supply voltage for forming a conducting path via the ground terminal to output one of the first and the second commutation detecting signals in the logic high status and forming one of the first and the second commutation detecting signals in the logic low status respectively.

Preferably, the first and the second statuses are a logic high and a logic low statuses respectively, each of the first and the second non-conductive signal amplifier circuits includes a detection current limiting resistor having a first terminal and a ground, and each of the first and the second opto-coupler driver circuits includes a first resistor having a first terminal coupled to the first terminal of the detection current limiting resistor and a second terminal, a first transistor having a first terminal coupled to the ground, a second terminal and a control terminal coupled to the second terminal of the first resistor, a second resistor having a first terminal receiving a DC supply voltage and a second terminal coupled to the second terminal of the first transistor, a third resistor having a first terminal coupled to the second terminal of the second resistor and a second terminal, a second transistor having a first terminal coupled to the ground, a second terminal and a control terminal coupled to the second terminal of the third resistor, a fourth resistor having a first terminal coupled to the second terminal of the second transistor and a second terminal outputting one of the transferred first and the transferred second non-conductive signals, an opto-coupler having two input terminals for receiving the supply voltage and receiving and transmitting one of the transferred first and the transferred second non-conductive signals respectively, an output terminal for outputting one of the transmitted and transferred first and the transmitted and transferred second non-conductive signals and a ground terminal, and a fifth resistor having a first terminal coupled to the outputting terminal for receiving one of the transmitted and transferred first and the transmitted and transferred second non-conductive signals and coupled to the outputting node for generating one of the first and the second commutation detecting signals, and a second terminal receiving the supply voltage for forming a conducting path via the ground terminal to output one of the first and the second commutation detecting signals in the logic high status and forming one of the first and the second commutation detecting signals in the logic low status respectively.

According to the third aspect of the present invention, a commutation failure detection circuit for a back-to-back SCR circuit includes a first detecting signal generator coupled to the back-to-back SCR circuit for detecting a commutation at a negative half cycle of an AC input voltage, and including a first non-conductive signal amplifier circuit generating a first non-conductive signal when the back-to-back SCR circuit is not conductive at the negative half cycle of the AC input voltage, and including a first non-conductive signal amplifier amplifying the first non-conductive signal.

Preferably, the commutation failure detection circuit further includes a second detecting signal generator coupled to the back-to-back SCR circuit for detecting the commutation at a positive half cycle of the AC input voltage, and including a second non-conductive signal amplifier circuit generating a second non-conductive signal when the back-to-back SCR circuit is not conductive at the positive half cycle of the AC input voltage, and including a second non-conductive signal amplifier amplifying the second non-conductive signal, a first opto-coupler driver circuit receiving, transferring and transmitting the first non-conductive signal for generating a first commutation detecting signal at a first status when the first non-conductive signal is absent, a second opto-coupler driver circuit receiving, transferring and transmitting the second non-conductive signal for generating a second commutation detecting signal at the first status when the second non-conductive signal is absent and an output node coupled to the first and the second opto-coupler driver circuits for outputting one of the first and the second commutation detecting signals, in which the first commutation detecting signal is in a second status when the first non-conductive signal is present, and the second commutation detecting signal is in the second status when the second non-conductive signal is present.

According to the fourth aspect of the present invention, a controlling method for a commutation failure detection circuit of a back-to-back SCR circuit, in which the back-to-back SCR circuit includes a first and a second SCRs each having a cathode, and the commutation failure detection circuit includes a first and a second non-conductive signal amplifier circuits coupled to cathodes of the first and the second SCRs respectively, a first and a second non-conductive signal drivers coupled to the first and the second non-conductive signal amplifier circuits respectively and a first and a second non-conductive signal isolators coupled to the first and the second non-conductive signal drivers respectively, includes the steps of: (a) causing a forward voltage to present across the first and the second SCRs; (b) causing the second non-conductive signal amplifier circuit to be turned on so as to turn on the second non-conductive signal driver such that the second non-conductive signal isolator outputs a commutation detecting signal having a first status when a first potential voltage of the cathode of the first SCR is higher than a second potential voltage of the cathode of the second SCR, neither of the first and the second SCRs is conducting and it is during a positive half cycle of an AC input voltage of the first and the second SCRs; and (c) causing the second non-conductive signal amplifier circuit to be turned off so as to turn off the second non-conductive signal driver such that the second non-conductive signal isolator outputs the commutation selecting signal having a second status when a difference between the first potential voltage and the second potential voltage equals to the forward voltage, one of the first and the second SCRs is conducting and it is during the positive half cycle of the AC input voltage.

Preferably, the first and the second statuses are a logic low and a logic high statuses respectively, the controlling method further includes the steps of: (d) causing the first non-conductive signal amplifier circuit to be turned on so as to turn on the first non-conductive signal driver such that the first non-conductive signal isolator outputs the commutation detecting signal having the logic low status when the second potential voltage is higher than the first potential voltage, both of the first and the second SCRs are not conducting and it is during a negative half cycle of the AC input voltage; and (e) causing the first non-conductive signal amplifier circuit to be turned off so as to turn off the first non-conductive signal driver such that the first non-conductive signal isolator outputs the commutation detecting signal having the logic high status when a difference between the second potential voltage and the first potential voltage equals to the forward voltage, one of the first and the second SCRs is conducting and it is during the negative half cycle of the AC input voltage.

Preferably, the first non-conductive signal amplifier circuit includes a first and a second transistors, the first non-conductive signal driver includes a third and a fourth transistors, the first non-conductive signal isolator includes an opto-coupler having two input terminals, and the step (d) further includes the steps of: (d1) causing the first transistor to be turned on so as to bias the second transistor to be turned on due to that the second potential voltage is higher than the first potential voltage; and (d2) causing the third transistor to be turned off and the two input terminals and the fourth transistor to form a conducting path such that the opto-coupler outputs the commutation signal having the logic low status, in which the step (e) further includes the steps of: (e1) causing the first transistor to be turned off so as to turn off the second transistor due to that the difference between the second potential voltage and the first potential voltage equals to the forward voltage; and (e2) causing the third transistor to be turned on, the fourth transistor to have a zero base current, and the two input terminals to form an open circuit such that the opto-coupler outputs the commutation signal having the logic high status.

Preferably, the first status is a logic low status, the second non-conductive signal amplifier circuit includes a first and a second transistors, the second non-conductive signal driver includes a third and a fourth transistors, the second non-conductive signal isolator includes an opto-coupler having two input terminals, and the step (b) further includes the steps of: (b1) causing the first transistor to be turned on so as to bias the second transistor to be turned on due to that the first potential voltage is higher than the second potential voltage; and (b2) causing the third transistor to be turned off and the two input terminals and the fourth transistor to form a conducting path such that the opto-coupler outputs the commutation signal having the logic low status.

Preferably, the second status is a logic high status, the step (c) further includes the steps of: (c1) causing the first transistor to be turned off so as to turn off the second transistor due to that a difference between the first potential voltage and the second potential voltage equals to the forward voltage; and (c2) causing the third transistor to be turned on, the fourth transistor to have a zero base current, and the two input terminals to form an open circuit such that the opto-coupler outputs the commutation signal having the logic high status.

The present invention may best be understood through the following descriptions with reference to the accompanying drawings, in which:

DETAILED DESCRIPTION OF THE PREFERRED EMBODIMENT

Figure 1:
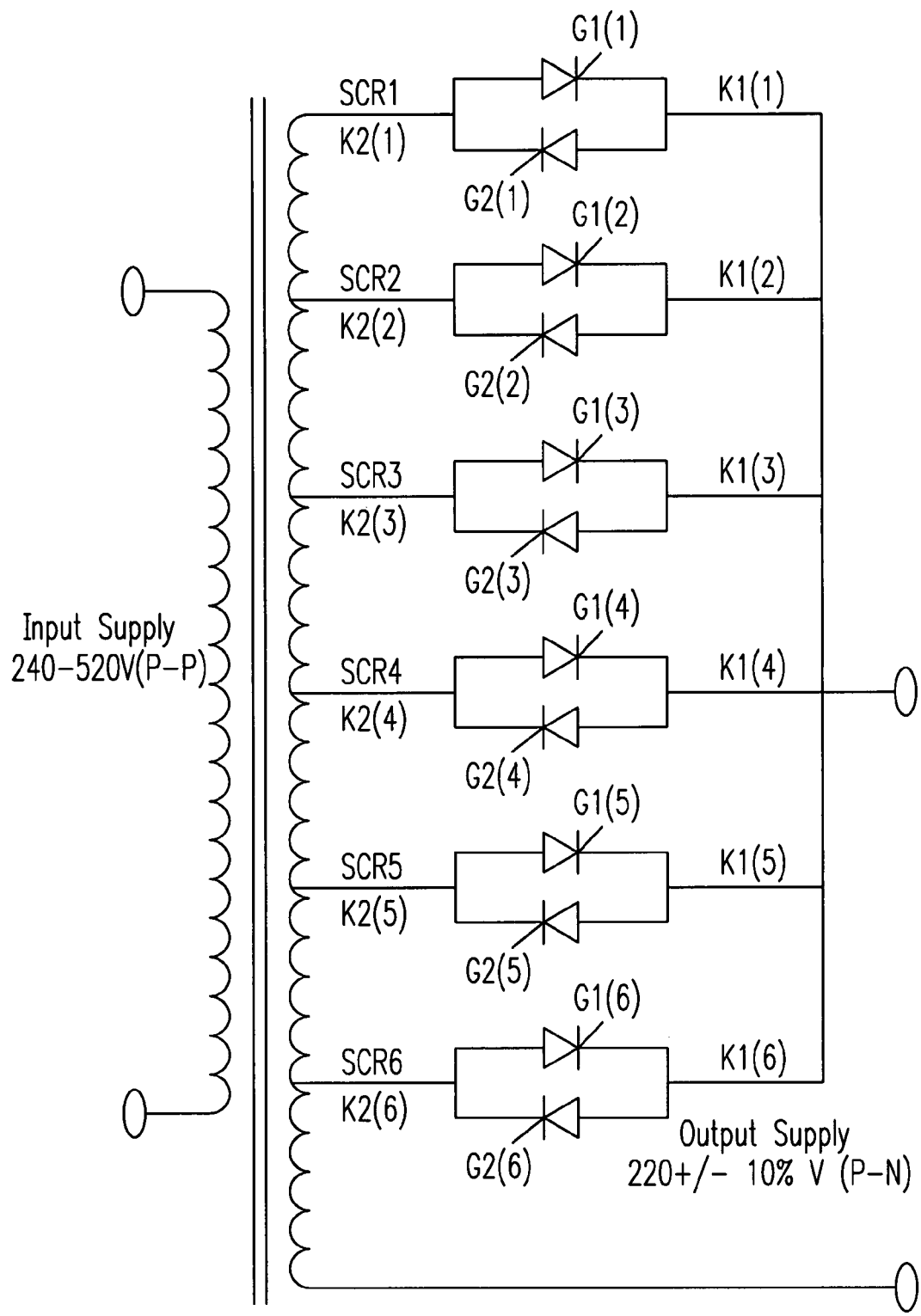
FIG. 1 shows a schematic circuit diagram of a conventional tap changing transformer.
Figure 2:
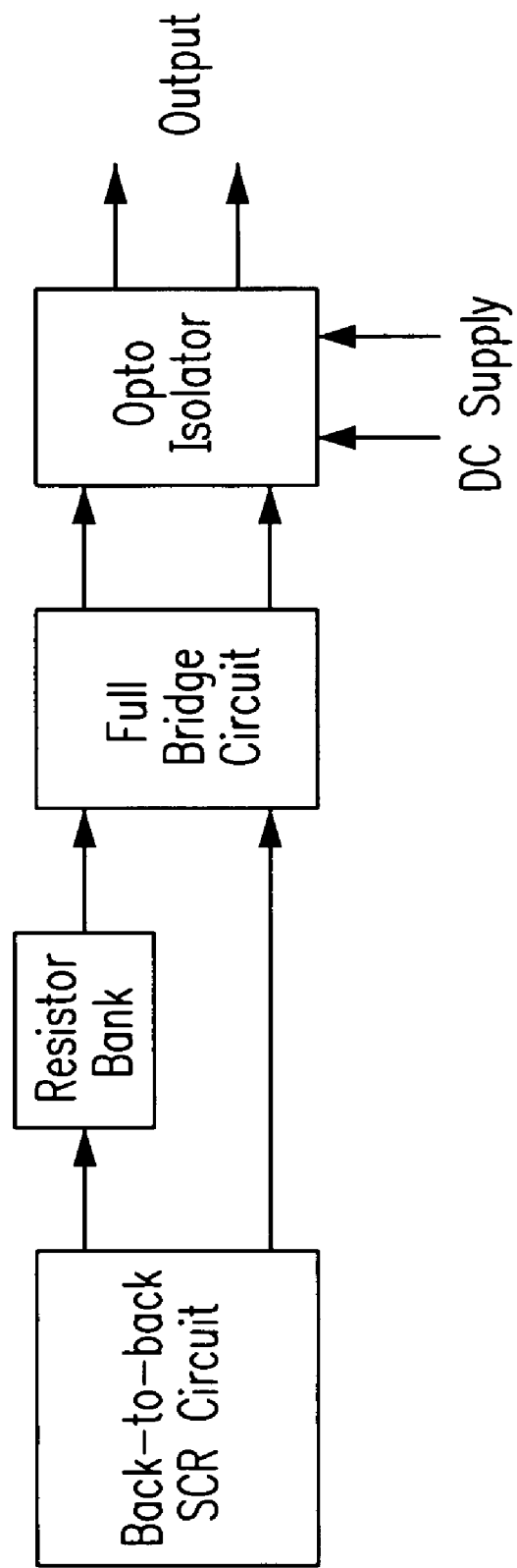
FIG. 2 shows a block diagram of a conventional commutation failure detection circuit using bridge and opto-coupler for a back-to-back SCR circuit.
Figure 3:
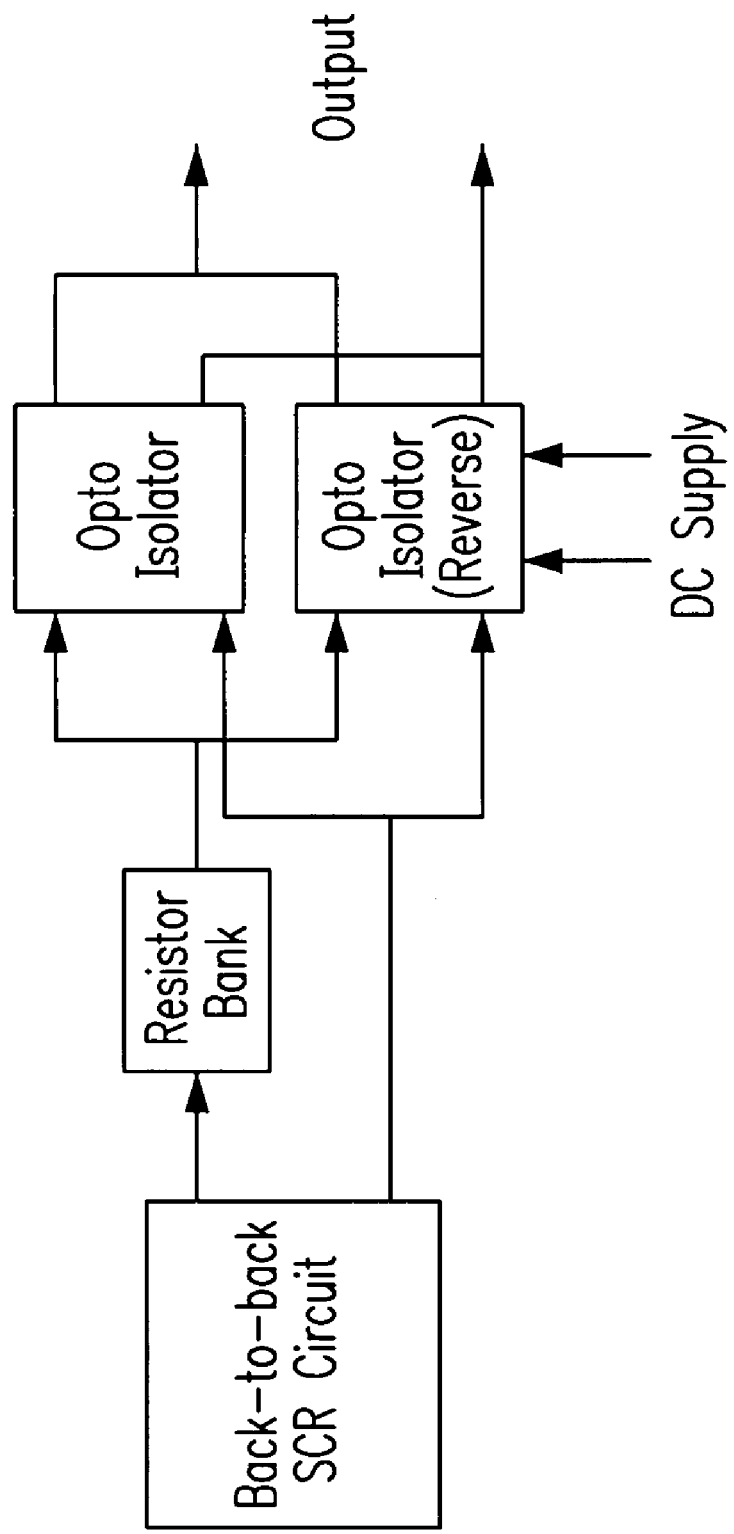
FIG. 3 shows a block diagram of a conventional commutation failure detection circuit using opto-couplers for a back-to-back SCR circuit.
Figure 4:
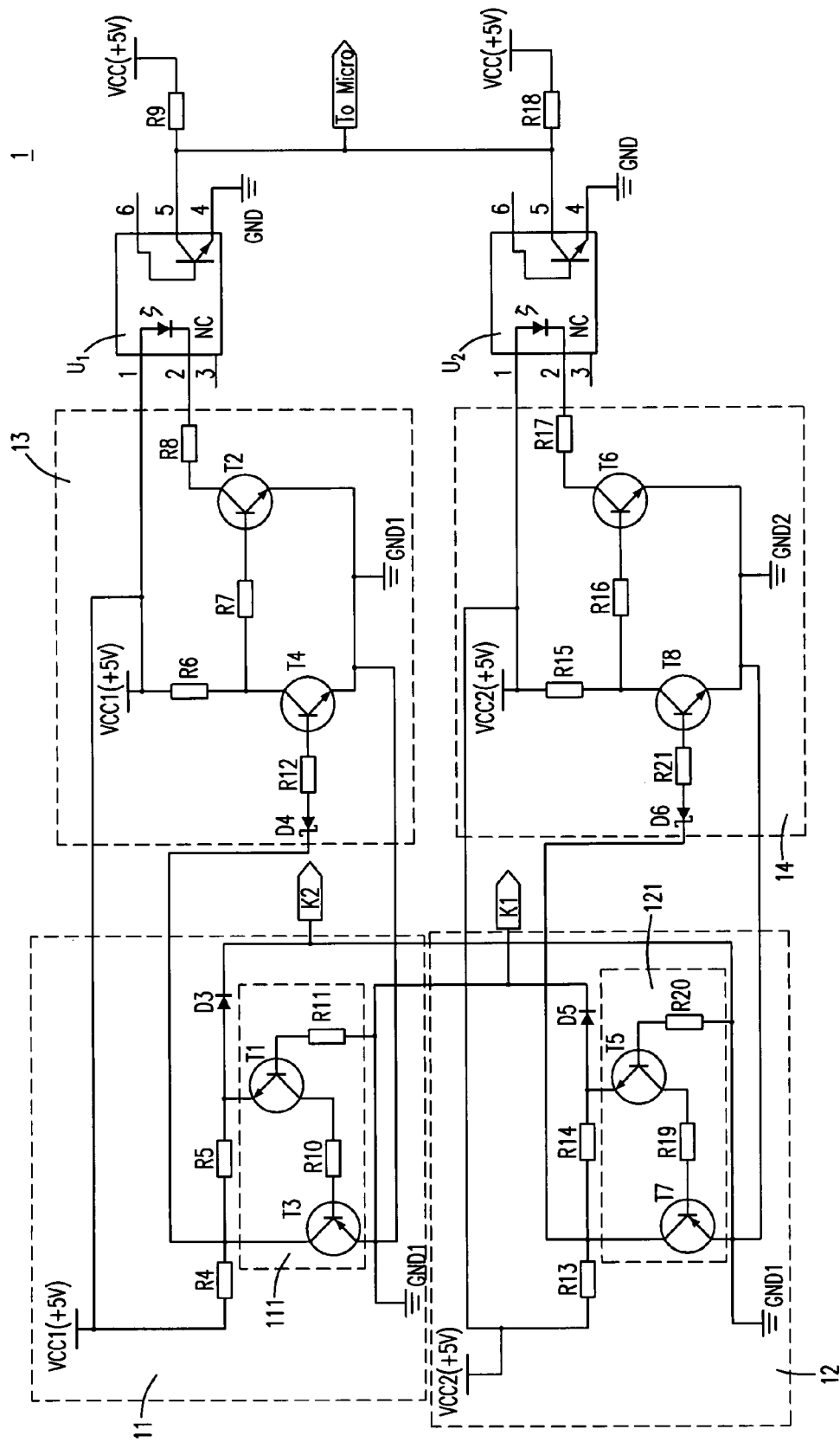
FIG. 4 shows a circuit diagram of a commutation failure detection circuit for a back-to-back SCR circuit according to the first preferred embodiment of the present invention.

Please refer to FIG. 4, which shows a circuit diagram of a commutation failure detection circuit for a back-to-back SCR circuit according to the first preferred embodiment of the present invention. The provided commutation failure detection circuit for a back-to-back SCR circuit according to the first preferred embodiment of the present invention 1 includes a first detecting signal generator coupled to a cathode of a first SCR of a SCR pair of the back-to-back SCR circuit (not shown) at connector K2 for detecting a commutation at a negative half cycle of an AC input voltage and including a first non-conductive signal amplifier circuit 11 for generating a first non-conductive signal when the back-to-back SCR circuit is not conductive at the negative half cycle of the AC input voltage, a first non-conductive signal driver 13 for receiving and transferring the first non-conductive signal, and a first non-conductive signal isolator including a first opto-coupler U1 and a resistor R9 for receiving the transferred first non-conductive signal and generating a first commutation detecting signal at a logic high status when the first non-conductive signal is absent, a second detecting signal generator coupled to the cathode of the second SCR of the back-to-back SCR circuit at connector K1 for detecting the commutation at a positive half cycle of the AC input voltage and including a second non-conductive signal amplifier circuit 12 for generating a second non-conductive signal when the back-to-back SCR circuit is not conductive at the positive half cycle of the AC input voltage, a second non-conductive signal driver 14 for receiving and transferring the second non-conductive signal and a second non-conductive signal isolator including a second opto-coupler U2 and a resistor R18 for receiving the transferred second non-conductive signal and generating a second commutation detecting signal at the logic high status when the second non-conductive signal is absent, and an output node (connected to the connector "To Micro") coupled to the first and the second non-conductive signal isolators for outputting one of the first and the second commutation detecting signals.

In which, the first non-conductive signal amplifier circuit 11 includes a signal bias resistor R4, a detection current limiting resistor R5, a reverse blocking diode D3 and a signal amplifier 111 including a first stage having a transistor T1 and a resistor R11, and a second stage having a transistor T3 and a resistor R10. The second non-conductive signal amplifier circuit 12 includes a signal bias resistor R13, a detection current limiting resistor R14, a reverse blocking diode D5 and a signal amplifier 121 including a first stage having a transistor T5 and a resistor R20, and a second stage having a transistor T7 and a resistor R19. The first non-conductive signal driver 13 includes a zener diode D4 (which is an option and could be omitted in a different preferred embodiment), a resistor R12, a transistor T4, a resistor R6, a resistor R7, a transistor T2, and a resistor R8. And the second non-conductive signal driver 14 includes a zener diode D6 (which is also an option and could be omitted in another preferred embodiment), a resistor R21, a transistor T8, a resistor R15, a resistor R16, a transistor T6, and a resistor R17.

Assume that the first SCR of the SCR pair of the back-to-back SCR circuit (not shown) is triggered at some firing angle in the positive half cycle of the AC input voltage (not shown) of the back-to-back SCR circuit. Then a forward voltage is present across the SCR pair until any one of the SCR pair starts conducting.

During the positive half cycle, a potential voltage at terminal K2 is grater than that of K1. This positive potential turns the transistor T5 on which then biases the transistor T7 on. Therefore, the total voltage is applied across the parallel combination of resistors R14, R19 and R20, and the collector of the transistor T7 is pulled down to ground. During this period, the transistor T8 is off. The opto-diode of U2 conducts through the transistor T6, which switches the opto-coupler (U2) output to logic low.

During the SCR conducting period, a potential difference between the terminals K2 & K1 is equal to the SCR forward voltage drop. This voltage is very small, so the transistors T5 & T7 are switched off. A DC supply (Vcc2, +5V) drives the transistor T8 on and turns the transistor T6 off. Therefore, opto-diode of U2 is open-circuited during this period and its output is logical high.

During a negative half cycle of the AC input voltage, a similar analysis is valid for the upper half of the commutation failure detection circuit for a back-to-back SCR circuit according to the first preferred embodiment of the present invention 1 (with a DC supply of Vcc1, +5V).

In this circuit, the blocking voltage during SCR off condition is used to drive one transistor on which in turn amplifies the signal to turn on the second stage transistor. Therefore, the current flowing through the current limiting resistors is not directly involved to get the commutation information. As a result, the commutation of the SCR can be sensed with very little delay.

Figure 5:
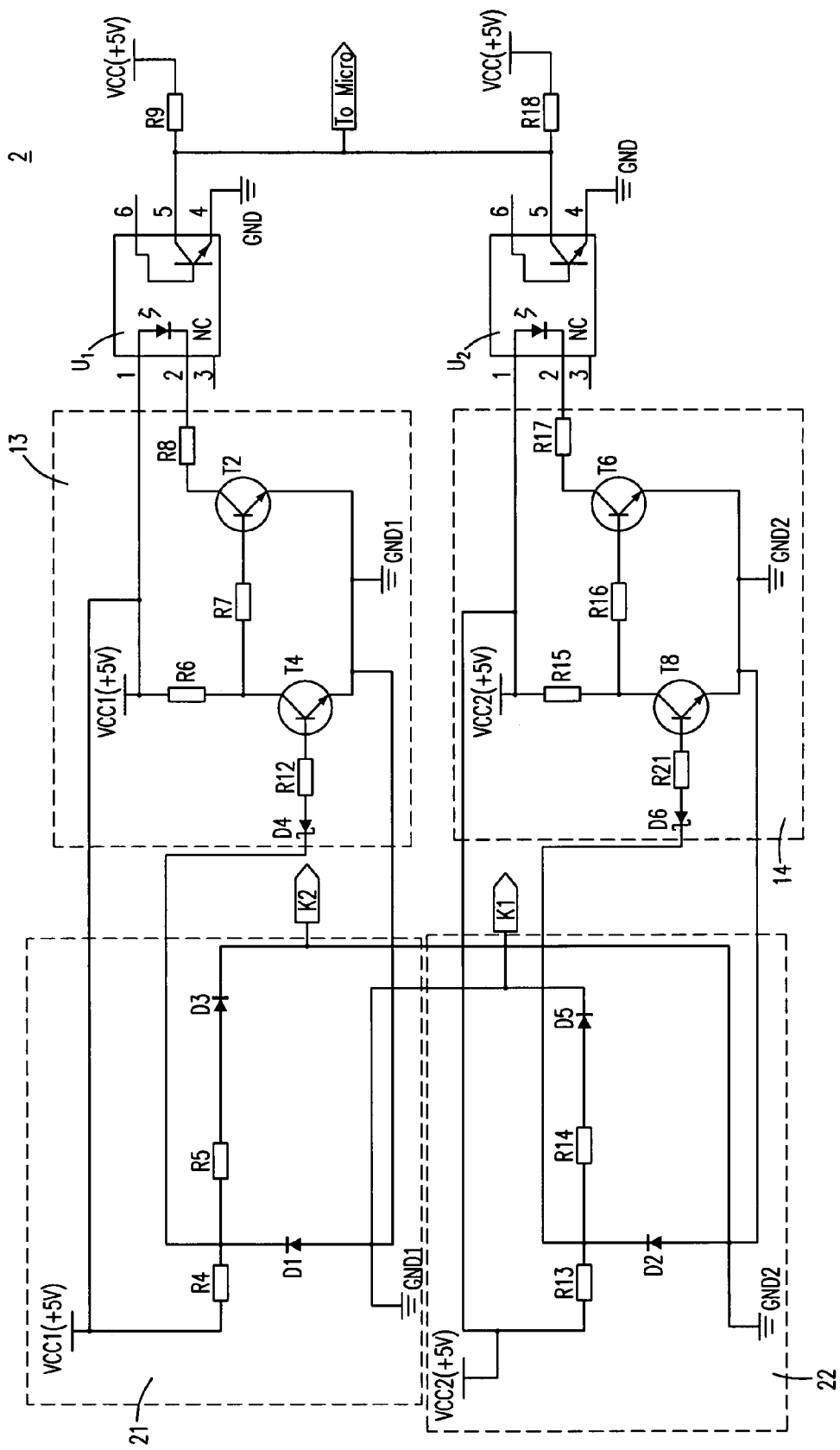
FIG. 5 shows a circuit diagram of a commutation failure detection circuit for a back-to-back SCR circuit according to the second preferred embodiment of the present invention.

Please refer to FIG. 5, which shows a circuit diagram of a commutation failure detection circuit for a back-to-back SCR circuit according to the second preferred embodiment of the present invention. The provided commutation failure detection circuit for a back-to-back SCR circuit according to the second preferred embodiment of the present invention 2 includes a first detecting signal generator coupled to the cathode of the first SCR of the back-to-back SCR circuit (not shown) at connector K2 for detecting a commutation at a negative half cycle of an AC input voltage and including a first non-conductive signal amplifier circuit 21 for generating a first non-conductive signal when the back-to-back SCR circuit is not conductive at the negative half cycle of the AC input voltage, a first non-conductive signal driver 13 for receiving and transferring the first non-conductive signal, and a first non-conductive signal isolator including a first opto-coupler U1 and a resistor R9 for receiving the transferred first non-conductive signal and generating a first commutation detecting signal at a logic high status when the first non-conductive signal is absent, a second detecting signal generator coupled to the cathode of the second SCR of the back-to-back SCR circuit at connector K1 for detecting the commutation at a positive half cycle of the AC input voltage and including a second non-conductive signal amplifier circuit 22 for generating a second non-conductive signal when the back-to-back SCR circuit is not conductive at the positive half cycle of the AC input voltage, a second non-conductive signal driver 14 for receiving and transferring the second non-conductive signal and a second non-conductive signal isolator including a second opto-coupler U2 and a resistor R18 for receiving the transferred second non-conductive signal and generating a second commutation detecting signal at the logic high status when the second non-conductive signal is absent, and an output node (connected to the connector "To Micro") coupled to the first and the second non-conductive signal isolators for outputting one of the first and the second commutation detecting signals.

In FIG. 5, the first non-conductive signal amplifier circuit 21 includes a signal bias resistor R4, a detection current limiting resistor R5, a reverse blocking diode D3 and a signal amplifier including a diode D1. The second non-conductive signal amplifier circuit 22 includes a signal bias resistor R13, a detection current limiting resistor R14, a reverse blocking diode D5 and a signal amplifier including a diode D2. The first non-conductive signal driver 13 and the second non-conductive signal driver 14 are the same as those of FIG. 4.

Also assume that the first SCR of a SCR pair of the back-to-back SCR circuit (not shown) is triggered at some firing angle in the positive half cycle of the AC input voltage (not shown) of the back-to-back SCR circuit. Then a forward voltage is present across the SCR pair until any one of the SCR pair starts conducting.

During the positive half cycle, the potential voltage at terminal K2 is grater than that of K1. This positive potential turns the diode D2 on. Therefore, the total voltage is applied across the resistor R14. During this period, the transistor T8 is off. The opto-diode of U2 conducts through the transistor T6, which switches the opto-coupler (U2) output to logic low.

During the SCR conducting period, a potential difference between the terminals K2 & K1 is equal to the SCR forward voltage drop. This voltage is very small, so the diode D2 is switched off. A DC supply (Vcc2, +5V) drives the transistor T8 on and turns the transistor T6 off. Therefore, opto-diode of U2 is open-circuited during this period and its output is logical high.

During a negative half cycle of the AC voltage, a similar analysis is also valid for the upper half of the commutation failure detection circuit for a back-to-back SCR circuit according to the second preferred embodiment of the present invention 2 (with a DC supply of Vcc1, +5V).

Basically, the commutation failure detection circuit according to the second preferred embodiment of the present invention 2 has a relatively simpler configuration than the commutation failure detection circuit according to the first preferred embodiment of the present invention 1 since the signal amplifiers 111 and 121 are replaced by diodes D1 and D2. But the delay at zero current cross of the commutation failure detection circuit according to the second preferred embodiment of the present invention 2 is relatively a little bit longer than that of the commutation failure detection circuit according to the first preferred embodiment of the present invention 1.

Figure 6:
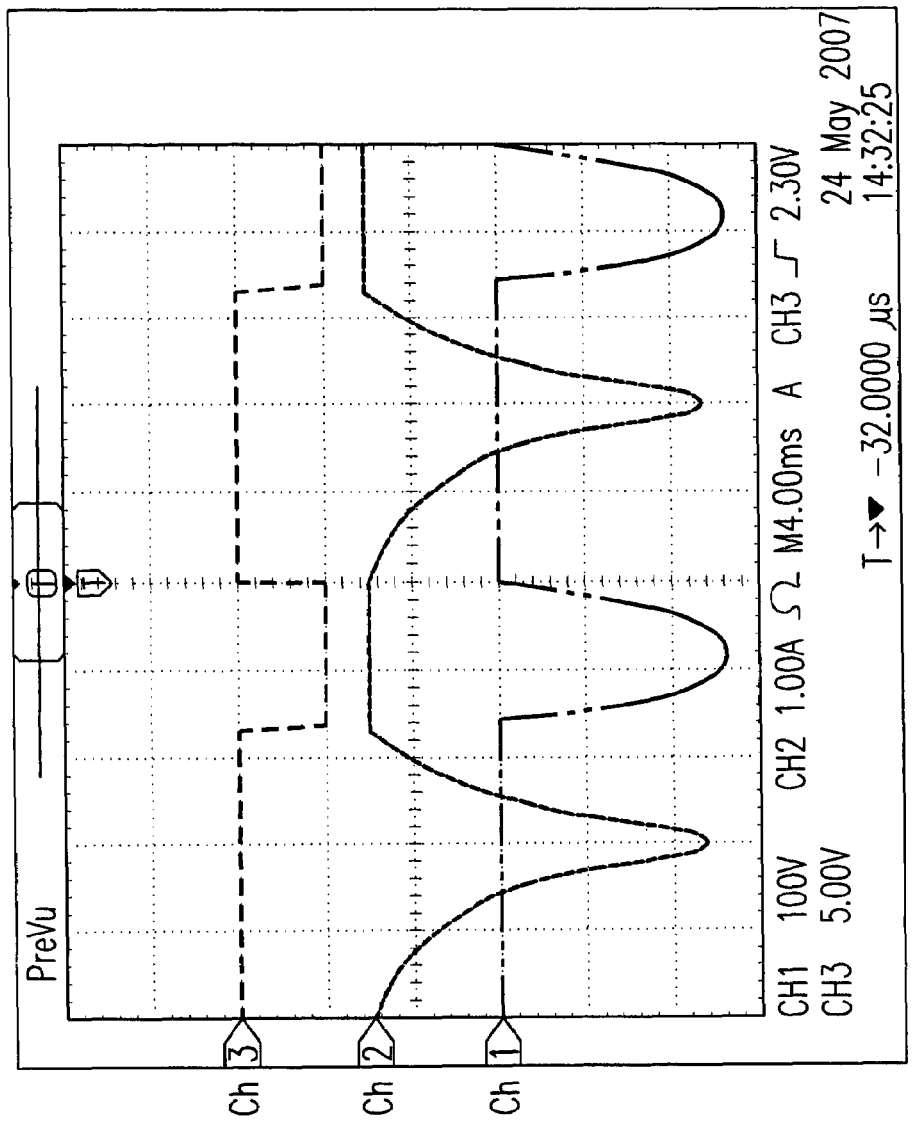
FIG. 6 shows a waveform diagram of voltage across SCR, current flowing through SCR and control signal at the collector of T7 as shown in FIG. 4 vs. time according to the first preferred embodiment of the present invention respectively.
Figure 7:
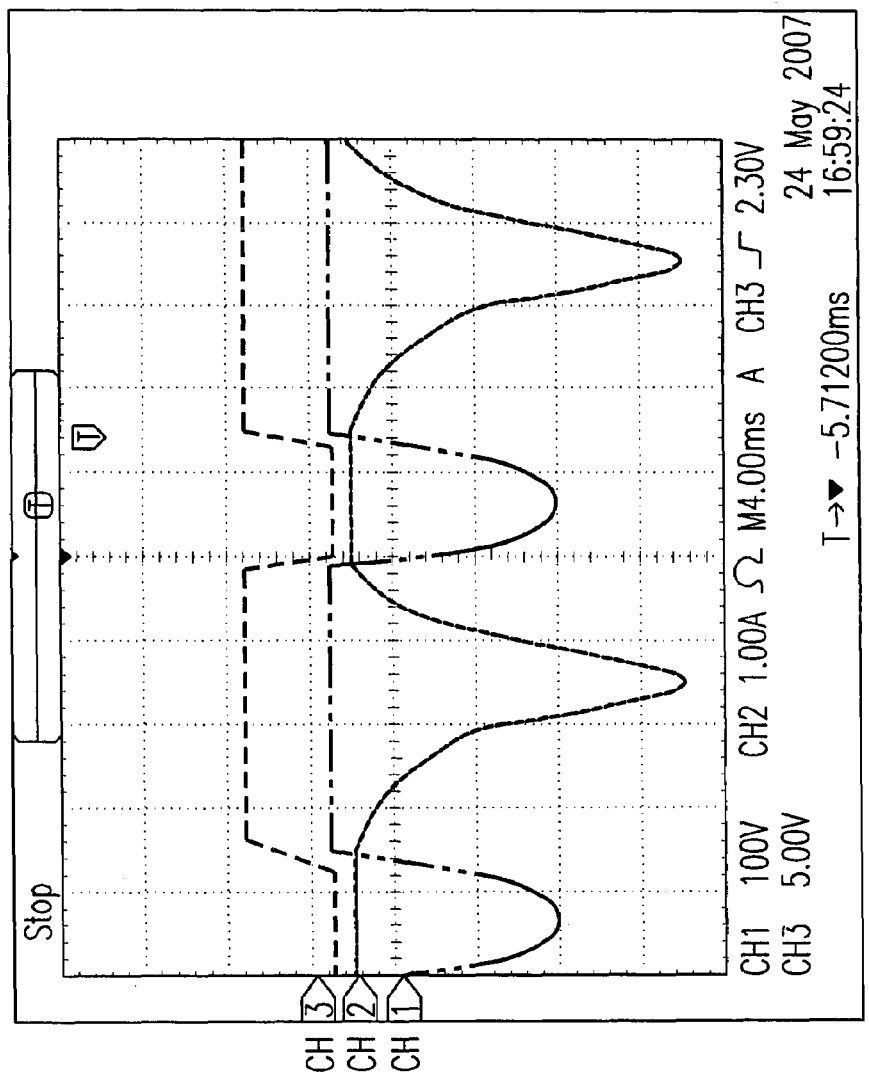
FIG. 7 shows a waveform diagram of voltage across SCR, current flowing through SCR and control signal at the cathode of D2 as shown in FIG. 5 vs. time according to the second preferred embodiment of the present invention respectively.

To show this, a test is conducted on a single SCR with a load of 60 W incandescent bulb+40 W fluorescent tube and the I/P Voltage is 240V AC. Please refer to FIG. 6, which shows a waveform diagram of voltage across SCR, current flowing through SCR and control signal at the collector of T7 as that of FIG. 4 vs. time according to the first preferred embodiment of the present invention respectively. In FIG. 7, it shows a waveform diagram of voltage across SCR, current flowing through SCR and control signal at the cathode of D2 as that of FIG. 5 vs. time according to the second preferred embodiment of the present invention respectively. Referring to FIGS. 6 and 7, Ch1 represents the waveform of voltage across SCR, Ch2 represents the waveform of current flowing through SCR, and Ch3 represents the waveform of control signal at the collector of T7 or cathode of D2 as those of FIGS. 4 and 5 respectively. In FIG. 7, there is a relatively more significant delay between current zero cross and the control single being triggered. In FIG. 6, however, the delay is relatively much more insignificant.

In conclusion, the provided commutation failure detection circuit and the controlling method thereof have the advantages of minimizing the delay present in commutation failure detection of the back-to-back SCR circuit.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A commutation failure detection circuit for a back-to-back silicon controlled rectifier (SCR) circuit, comprising:
   a first detecting signal generator coupled to the back-to-back SCR circuit for detecting a commutation at a negative half cycle of an AC input voltage, comprising:
   a first non-conductive signal amplifier circuit generating a first non-conductive signal when the back-to-back SCR circuit is not conductive at the negative half cycle of the AC input voltage;
   a first non-conductive signal driver receiving and transferring the first non-conductive signal; and
   a first non-conductive signal isolator receiving the transferred first non-conductive signal for generating a first commutation detecting signal at a first status when the first non-conductive signal is absent; and
   a second detecting signal generator coupled to the back-to-back SCR circuit for detecting the commutation at a positive half cycle of the AC input voltage, comprising:
   a second non-conductive signal amplifier circuit generating a second non-conductive signal when the back-to-back SCR circuit is not conductive at the positive half cycle of the AC input voltage;
   a second non-conductive signal driver receiving and transferring the second non-conductive signal; and
   a second non-conductive signal isolator receiving the transferred second non-conductive signal for generating a second commutation detecting signal at the first status when the second non-conductive signal is absent.

2. A detection circuit according to claim 1, further comprising an output node coupled to the first and the second non-conductive signal isolators for outputting one of the first and the second commutation detecting signals, wherein the first commutation detecting signal is in a second status when the first non-conductive signal is present, and the second commutation detecting signal is in the second status when the second non-conductive signal is present.

3. A detection circuit according to claim 2, wherein the first and the second statuses are a logic high and a logic low statuses respectively, each of the first and the second non-conductive signal isolators comprises:
   an opto-coupler having two input terminals for receiving a DC supply voltage and receiving and transmitting one of the transferred first and the transferred second non-conductive signals respectively, an output terminal for outputting one of the transmitted and transferred first and the transmitted and transferred second non-conductive signals and a ground terminal; and
   a first resistor having a first terminal coupled to the outputting terminal for receiving one of the transmitted and transferred first and the transmitted and transferred second non-conductive signals and coupled to the outputting node for generating one of the first and the second commutation detecting signals, and a second terminal receiving a supply voltage for forming a conducting path via the ground terminal to output one of the first and the second commutation detecting signals in the logic high status and forming the first and the second commutation detecting signals in the logic low status respectively.

4. A detection circuit according to claim 1, wherein the back-to-back SCR circuit comprises a first and a second SCRs each having a cathode, the first non-conductive signal amplifier circuit is coupled to the cathode of the first SCR, the second non-conductive signal amplifier circuit is coupled to the cathode of the second SCR, and each of the first and the second non-conductive signal amplifier circuits comprises:
   a signal bias resistor having a first terminal coupled to a DC supply voltage for forming a non-conductive signal bias and a second terminal;
   a detection current limiting resistor having a first terminal coupled to the second terminal of the signal bias resistor for limiting a detection current flowing through the detection current limiting resistor and a second terminal;
   a reverse blocking diode having an anode coupled to the second terminal of the detection current limiting resistor and a cathode coupled to one of the cathodes of the first and the second SCRs for preventing a reverse voltage thereof; and
   a signal amplifier amplifying one of the first and the second non-conductive signals, comprising:
   a first stage, comprising:
      a first transistor having a first terminal coupled to the anode of the reverse blocking diode, a second terminal and a control tenininal; and
      a first resistor having a first terminal coupled to the control terminal of the first transistor and a second terminal coupled to one of the cathodes of the first and the second SCRs; and
   a second stage, comprising:
      a second transistor having a first terminal coupled to the second terminal of the first resistor and a ground, a second terminal coupled to the first terminal of the detection current limiting resistor and a control terminal; and a second resistor having a first terminal coupled to the control terminal of the second transistor and a second terminal coupled to the second terminal of the first transistor.

5. A detection circuit according to claim 4, wherein each of the first and the second non-conductive signal drivers comprises:

a zener diode having an anode and a cathode coupled to the first terminal of the detection current limiting resistor;

a third resistor having a first terminal coupled to the anode of the zener diode and a second terminal;

a third transistor having a first terminal coupled to the ground, a second terminal and a control terminal coupled to the second terminal of the third resistor;

a fourth resistor having a first terminal receiving the supply voltage and a second terminal coupled to the second terminal of the third transistor;

a fifth resistor having a first terminal coupled to the second terminal of the fourth resistor and a second terminal;

a fourth transistor having a first terminal coupled to the ground, a second terminal and a control terminal coupled to the second terminal of the fifth resistor, and a sixth resistor having a first terminal coupled to the second terminal of the fourth transistor and a second terminal outputting one of the transferred first and the transferred second non-conductive signals.

6. A detection circuit according to claim 4, wherein each of the first and the second non-conductive signal drivers comprises:

a third resistor having a first terminal coupled to the first terminal of the detection current limiting resistor and a second terminal;

a third transistor having a first terminal coupled to the ground, a second terminal and a control terminal coupled to the second terminal of the third resistor;

a fourth resistor having a first terminal receiving the supply voltage and a second terminal coupled to the second terminal of the third transistor;

a fifth resistor having a first terminal coupled to the second terminal of the fourth resistor and a second terminal;

a fourth transistor having a first terminal coupled to the ground, a second terminal and a control terminal coupled to the second terminal of the fifth resistor; and a sixth resistor having a first terminal coupled to the second terminal of the fourth transistor and a second terminal outputting one of the transferred first and the transferred second non-conductive signals.

7. A detection circuit according to claim 1, wherein the back-to-back SCR circuit comprises a first and a second SCRs each having a cathode, the first non-conductive signal amplifier circuit is coupled to the cathode of the first SCR, the second non-conductive signal amplifier circuit is coupled to the cathode of the second SCR, and each of the first and the second non-conductive signal amplifier circuits comprises:

a signal bias resistor having a first terminal coupled to a DC supply voltage for forming a non-conductive signal bias and a second terminal;

a detection current limiting resistor having a first terminal coupled to the second terminal of the signal bias resistor for limiting a detection current flowing through the detection current limiting resistor and a second terminal;

a reverse blocking diode having an anode coupled to the second terminal of the detection current limiting resistor and a cathode coupled to one of the cathodes of the first and the second SCRs for preventing a reverse voltage thereof; and a signal amplifier amplifying one of the first and the second non-conductive signals and comprising an amplifying diode having an anode coupled to a ground and one of the cathodes of the first and the second SCRs and a cathode coupled to the first terminal of the detection current limiting resistor.

8. A detection circuit according to claim 7, wherein each of the first and the second non-conductive signal drivers comprises:

a zener diode having an anode and a cathode coupled to the first terminal of the detection current limiting resistor;

a first resistor having a first terminal coupled to the anode of the zener diode and a second terminal;

a first transistor having a first terminal coupled to the ground, a second terminal and a control terminal coupled to the second terminal of the first resistor;

a second resistor having a first terminal receiving the supply voltage and a second terminal coupled to the second terminal of the first transistor;

a third resistor having a first terminal coupled to the second terminal of the second resistor and a second terminal;

a second transistor having a first terminal coupled to the ground, a second terminal and a control terminal coupled to the second terminal of the third resistor; and a fourth resistor having a first terminal coupled to the second terminal of the second transistor and a second terminal outputting one of the transferred first and the transferred second non-conductive signals.

9. A detection circuit according to claim 7, wherein each of the first and the second non-conductive signal drivers comprises:

a first resistor having a first terminal coupled to the first terminal of the detection current limiting resistor and a second terminal;

a first transistor having a first terminal coupled to the ground, a second terminal and a control terminal coupled to the second terminal of the first resistor;

a second resistor having a first terminal receiving the supply voltage and a second terminal coupled to the second terminal of the first transistor;

a third resistor having a first terminal coupled to the second terminal of the second resistor and a second terminal;

a second transistor having a first terminal coupled to the ground, a second terminal and a control terminal coupled to the second terminal of the third resistor; and a fourth resistor having a first terminal coupled to the second terminal of the second transistor and a second terminal outputting one of the transferred first and the transferred second non-conductive signals.

10. A commutation failure detection circuit for a back-to-back SCR circuit, comprising:

a first detecting signal generator coupled to the back-to-back SCR circuit for detecting a commutation at a negative half cycle of an AC input voltage, comprising:

a first non-conductive signal amplifier circuit generating a first non-conductive signal when the back-to-back SCR circuit is not conductive at the negative half cycle of the AC input voltage, and comprising a first non-conductive signal amplifier amplifying the first non- conductive signal; and a second detecting signal generator coupled to the back-to-back SCR circuit for detecting the commutation at a positive half cycle of the AC input voltage, comprising:

a second non-conductive signal amplifier circuit generating a second non-conductive signal when the back-to-back SCR circuit is not conductive at the positive half cycle of the AC input voltage, and comprising a second non-conductive signal amplifier amplifying the second non-conductive signal.

11. A detection circuit according to claim 10, further comprising a first opto-coupler driver circuit receiving, transferring and transmitting the first non-conductive signal for generating a first commutation detecting signal at a first status when the first non-conductive signal is absent and a second opto-coupler driver circuit receiving, transferring and transmitting the second non-conductive signal for generating a second commutation detecting signal at the first status when the second non-conductive signal is absent and an output node coupled to the first and the second opto-coupler driver circuits for outputting one of the first and the second commutation detecting signals, wherein the first commutation detecting signal is in a second status when the first non-conductive signal is present, and the second commutation detecting signal is in the second status when the second non-conductive signal is present.

12. A detection circuit according to claim 11, wherein the first and the second statuses are a logic high and a logic low statuses respectively, each of the first and the second non-conductive signal amplifier circuits comprises a detection current limiting resistor having a first terminal and a ground, and each of the first and the second opto-coupler driver circuits comprises:
    a zener diode having an anode and a cathode coupled to the first terminal of the detection current limiting resistor;
    a third resistor having a first terminal coupled to the anode of the zener diode and a second terminal;
    a third transistor having a first terminal coupled to the ground, a second terminal and a control terminal coupled to the second terminal of the third resistor;
    a fourth resistor having a first terminal receiving a DC supply voltage and a second terminal coupled to the second terminal of the third transistor;
    a fifth resistor having a first terminal coupled to the second terminal of the fourth resistor and a second terminal;
    a fourth transistor having a first terminal coupled to the ground, a second terminal and a control terminal coupled to the second terminal of the fifth resistor;
    a sixth resistor having a first terminal coupled to the second terminal of the fourth transistor and a second terminal outputting one of the transferred first and the transferred second non-conductive signals;
    an opto-coupler having two input terminals for receiving the supply voltage and receiving and transmitting one of the transferred first and the transferred second non-conductive signals respectively, an output terminal for outputting one of the transmitted and transferred first and the transmitted and transferred second non-conductive signals and a ground terminal; and
    a seventh resistor having a first terminal coupled to the outputting terminal for receiving one of the transmitted and transferred first and the transmitted and transferred second non- conductive signals and coupled to the outputting node for generating one of the first and the second commutation detecting signals, and a second terminal receiving the supply voltage for forming a conducting path via the ground terminal to output one of the first and the second commutation detecting signals in the logic high status and forming one of the first and the second commutation detecting signals in the logic low status respectively.

13. A detection circuit according to claim 11, wherein the first and the second statuses are a logic high and a logic low statuses respectively, each of the first and the second non-conductive signal amplifier circuits comprises a detection current limiting resistor having a first terminal and a ground, and each of the first and the second opto-coupler driver circuits comprises:
    a third resistor having a first terminal coupled to the first terminal of the detection current limiting resistor and a second terminal;
    a third transistor having a first terminal coupled to the ground, a second terminal and a control terminal coupled to the second terminal of the third resistor;
    a fourth resistor having a first terminal receiving a DC supply voltage and a second terminal coupled to the second terminal of the third transistor;
    a fifth resistor having a first terminal coupled to the second terminal of the fourth resistor and a second terminal;
    a fourth transistor having a first terminal coupled to the ground, a second terminal and a control terminal coupled to the second terminal of the fifth resistor;
    a sixth resistor having a first terminal coupled to the second terminal of the fourth transistor and a second terminal outputting one of the transferred first and the transferred second non-conductive signals;
    an opto-coupler having two input terminals for receiving the supply voltage and receiving and transmitting one of the transferred first and the transferred second non-conductive signals respectively, an output terminal for outputting one of the transmitted and transferred first and the transmitted and transferred second non-conductive signals and a ground terminal; and
    a seventh resistor having a first terminal coupled to the outputting terminal for receiving one of the transmitted and transferred first and the transmitted and transferred second non- conductive signals and coupled to the outputting node for generating one of the first and the second commutation detecting signals, and a second terminal receiving the supply voltage for forming a conducting path via the ground terminal to output one of the first and the second commutation detecting signals in the logic high status and forming one of the first and the second commutation detecting signals in the logic low status respectively.

14. A detection circuit according to claim 11, wherein the first and the second statuses are a logic high and a logic low statuses respectively, each of the first and the second non-conductive signal amplifier circuits comprises a detection current limiting resistor having a first terminal and a ground, and each of the first and the second opto-coupler driver circuits comprises:
    a zener diode having an anode and a cathode coupled to the first terminal of the detection current limiting resistor;
    a first resistor having a first terminal coupled to the anode of the zener diode and a second terminal;
    a first transistor having a first terminal coupled to the ground, a second terminal and a control terminal coupled to the second terminal of the first resistor;
    a second resistor having a first terminal receiving a DC supply voltage and a second terminal coupled to the second terminal of the first transistor;
    a third resistor having a first terminal coupled to the second terminal of the second resistor and a second terminal;
    a second transistor having a first terminal coupled to the ground, a second terminal and a control terminal coupled to the second terminal of the third resistor;

a fourth resistor having a first terminal coupled to the second terminal of the second transistor and a second terminal outputting one of the transferred first and the transferred second non-conductive signals;

an opto-coupler having two input terminals for receiving the supply voltage and receiving and transmitting one of the transferred first and the transferred second non-conductive signals respectively, an output terminal for outputting one of the transmitted and transferred first and the transmitted and transferred second non-conductive signals and a ground terminal; and a fifth resistor having a first terminal coupled to the outputting terminal for receiving one of the transmitted and transferred first and the transmitted and transferred second non-conductive signals and coupled to the outputting node for generating one of the first and the second commutation detecting signals, and a second terminal receiving the supply voltage for forming a conducting path via the ground terminal to output one of the first and the second commutation detecting signals in the logic high status and forming one of the first and the second commutation detecting signals in the logic low status respectively.

15. A detection circuit according to claim 11, wherein the first and the second statuses are a logic high and a logic low statuses respectively, each of the first and the second non-conductive signal amplifier circuits comprises a detection current limiting resistor having a first terminal and a ground, and each of the first and the second opto-coupler driver circuits comprises:

a first resistor having a first terminal coupled to the first terminal of the detection current limiting resistor and a second terminal;

a first transistor having a first terminal coupled to the ground, a second terminal and a control terminal coupled to the second terminal of the first resistor;

a second resistor having a first terminal receiving a DC supply voltage and a second terminal coupled to the second terminal of the first transistor;

a third resistor having a first terminal coupled to the second terminal of the second resistor and a second terminal;

a second transistor having a first terminal coupled to the ground, a second terminal and a control terminal coupled to the second terminal of the third resistor;

a fourth resistor having a first terminal coupled to the second terminal of the second transistor and a second terminal outputting one of the transferred first and the transferred second non-conductive signals;

an opto-coupler having two input terminals for receiving the supply voltage and receiving and transmitting one of the transferred first and the transferred second non-conductive signals respectively, an output terminal for outputting one of the transmitted and transferred first and the transmitted and transferred second non-conductive signals and a ground terminal; and a fifth resistor having a first terminal coupled to the outputting terminal for receiving one of the transmitted and transferred first and the transmitted and transferred second non-conductive signals and coupled to the outputting node for generating one of the first and the second commutation detecting signals, and a second terminal receiving the supply voltage for forming a conducting path via the ground terminal to output one of the first and the second commutation detecting signals in the logic high status and forming one of the first and the second commutation detecting signals in the logic low status respectively.

16. A commutation failure detection circuit for a back-to-back SCR circuit, comprising a first detecting signal generator coupled to the back-to-back SCR circuit for detecting a commutation at a negative half cycle of an AC input voltage, and including a first non-conductive signal amplifier circuit generating a first non-conductive signal when the back-to-back SCR circuit is not conductive at the negative half cycle of the AC input voltage, and including a first non-conductive signal amplifier amplifying the first non-conductive signal a second detecting signal generator coupled to the back-to-back SCR circuit for detecting the commutation at a positive half cycle of the AC input voltage, and comprising a second non-conductive signal amplifier circuit generating a second non-conductive signal when the back-to-back SCR circuit is not conductive at the positive half cycle of the AC input voltage, and comprising a second non-conductive signal amplifier amplifying the second non-conductive signal, a first opto-coupler driver circuit receiving, transferring and transmitting the first non-conductive signal for generating a first commutation detecting signal at a first status when the first non-conductive signal is absent, a second opto-coupler driver circuit receiving, transferring and transmitting the second non-conductive signal for generating a second commutation detecting signal at the first status when the second non-conductive signal is absent and an output node coupled to the first and the second opto-coupler driver circuits for outputting one of the first and the second commutation detecting signals, wherein the first commutation detecting signal is in a second status when the first non-conductive signal is present, and the second commutation detecting signal is in the second status when the second non-conductive signal is present.

* * * * *